United States Patent
Singh et al.

(10) Patent No.: US 11,538,731 B2
(45) Date of Patent: Dec. 27, 2022

(54) THERMAL SOLUTIONS FOR PACKAGE ON PACKAGE (POP) ARCHITECTURES

(71) Applicant: Intel Corporation, Santa Clara, CA (US)

(72) Inventors: Bijendra Singh, Karnataka (IN); Vikas Rao, Karnataka (IN); Sandesh Geejagaaru Krishnamurthy, Karnataka (IN); Navneet Kumar Singh, Karnataka (IN); Unnikrishnan Gopinanthan Pillai, Karnataka (IN)

(73) Assignee: Intel Corporation, Santa Clara, CA (US)

( * ) Notice: Subject to any disclaimer, the term of this patent is extended or adjusted under 35 U.S.C. 154(b) by 759 days.

(21) Appl. No.: 16/368,049

(22) Filed: Mar. 28, 2019

(65) Prior Publication Data
US 2020/0312736 A1 Oct. 1, 2020

(51) Int. Cl.
*H01L 23/367* (2006.01)
*H01L 23/498* (2006.01)
*H01L 23/48* (2006.01)

(52) U.S. Cl.
CPC ........ *H01L 23/3675* (2013.01); *H01L 23/481* (2013.01); *H01L 23/49844* (2013.01)

(58) Field of Classification Search
CPC ............... H01L 23/3675; H01L 23/481; H01L 23/49844
See application file for complete search history.

(56) References Cited

U.S. PATENT DOCUMENTS

| | | | | |
|---|---|---|---|---|
| 6,627,980 B2 * | 9/2003 | Eldridge | ............... | H01L 25/105 257/77 |
| 7,250,675 B2 * | 7/2007 | Fasano | ................ | H01L 25/0657 257/723 |
| 2011/0156244 A1 * | 6/2011 | Lou | ........................ | H01L 23/367 257/713 |
| 2013/0075887 A1 * | 3/2013 | Suzuki | .................. | H01L 25/105 257/686 |
| 2013/0223010 A1 * | 8/2013 | Shioga | .................. | H01L 23/427 438/122 |
| 2015/0236002 A1 * | 8/2015 | Haba | ....................... | H01L 25/18 257/713 |

* cited by examiner

*Primary Examiner* — Peniel M Gumedzoe
(74) *Attorney, Agent, or Firm* — Schwabe Williamson & Wyatt P.C.

(57) ABSTRACT

Embodiments disclosed herein include electronic packages with improved thermal performance. In an embodiment, the electronic package comprises a first package substrate, a first die stack over the first package substrate, and a heat spreader over the first die stack. In an embodiment, the heat spreader comprises arms that extend out past sidewalls of the first package substrate. In an embodiment, the electronic package further comprises an interposer over and around the heat spreader, where the interposer is electrically coupled to the first package substrate by a plurality of interconnects. In an embodiment, the electronic package further comprises a second package substrate over the interposer, and a second die over the second package substrate.

24 Claims, 13 Drawing Sheets

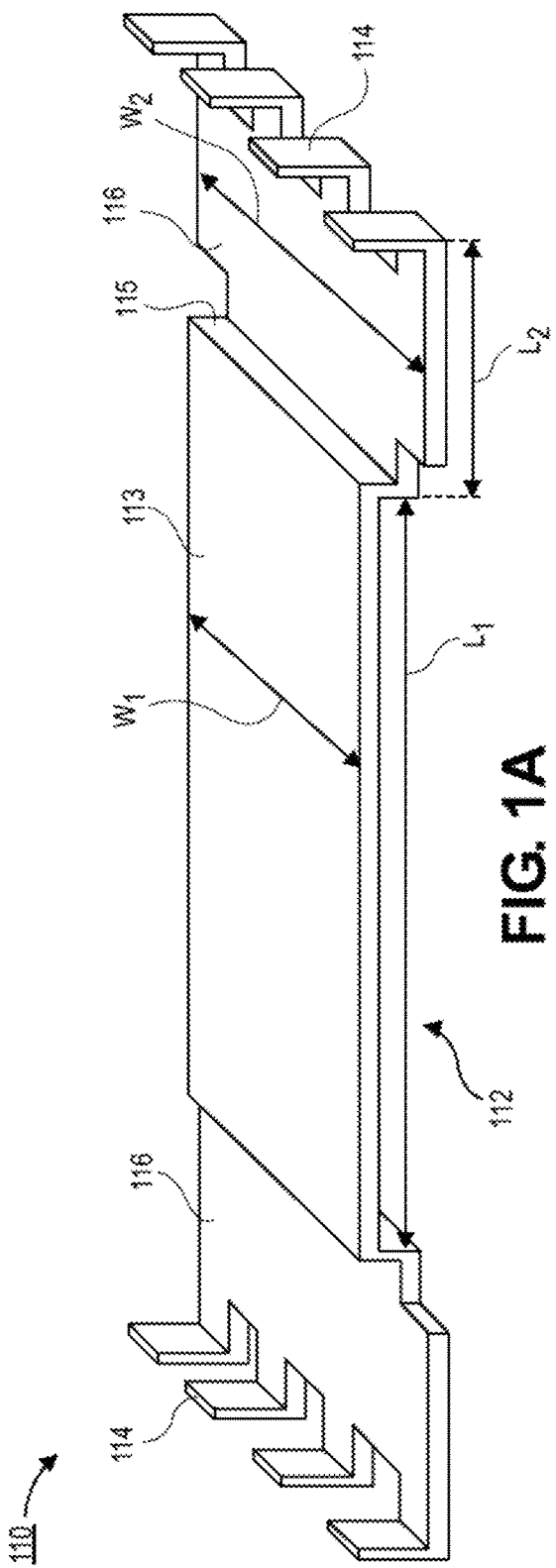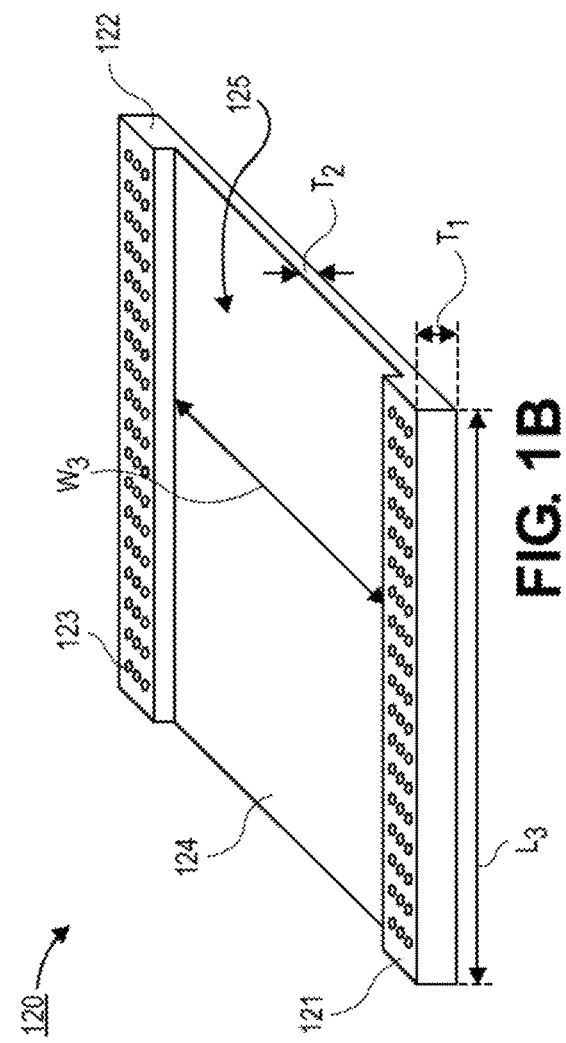

THERMAL SOLUTIONS FOR PACKAGE ON PACKAGE (POP) ARCHITECTURES

TECHNICAL FIELD

Embodiments of the present disclosure relate to electronic packaging, and more particularly, to package on package (PoP) architectures with thermal solutions to improve performance.

BACKGROUND

Package on package (PoP) architectures are critical for converged mobility and other mobile devices due to small real estate requirements of such devices. However, PoP packages suffer from significant thermal management issues. For example, the thermal resistance from the bottom die to the top of the PoP (where a heat spreader and/or a heatsink is attached) is significant. This limits the continuous and burst performance possible for a given temperature junction maximum ($T_J$max) allowed for the bottom die (i.e., the processor). Currently, underfill material may be provided in air gaps between the packages of a PoP device. However, underfill material does not have a high thermal conductivity, and therefore, does not significantly improve thermal resistance.

Such thermal issues are further complicated by the inclusion of custom memory packages to account for different die architectures. Custom memory packages are expensive and require painful SKU management to support different memory capacities. In order to avoid the need for custom memory packages, an interposer may be used. However, the interposer further increases the thermal resistance and adds additional height to the package.

The poor thermal conductivity also results in large thermal gradients across the processor die. For example, the thermal gradients on the processor die in PoP architectures may be 40° C. or greater and lead to sharp rises in junction temperature of the processor die. This results in highly constrained performance, especially for core intensive workloads.

BRIEF DESCRIPTION OF THE DRAWINGS

FIG. 1A is a perspective view illustration of heat spreader with a recess and legs, in accordance with an embodiment.

FIG. 1B is a perspective view illustration of an interposer with a channel for interfacing with the heat spreader, in accordance with an embodiment.

EMBODIMENTS OF THE PRESENT DISCLOSURE

Figure 1C:
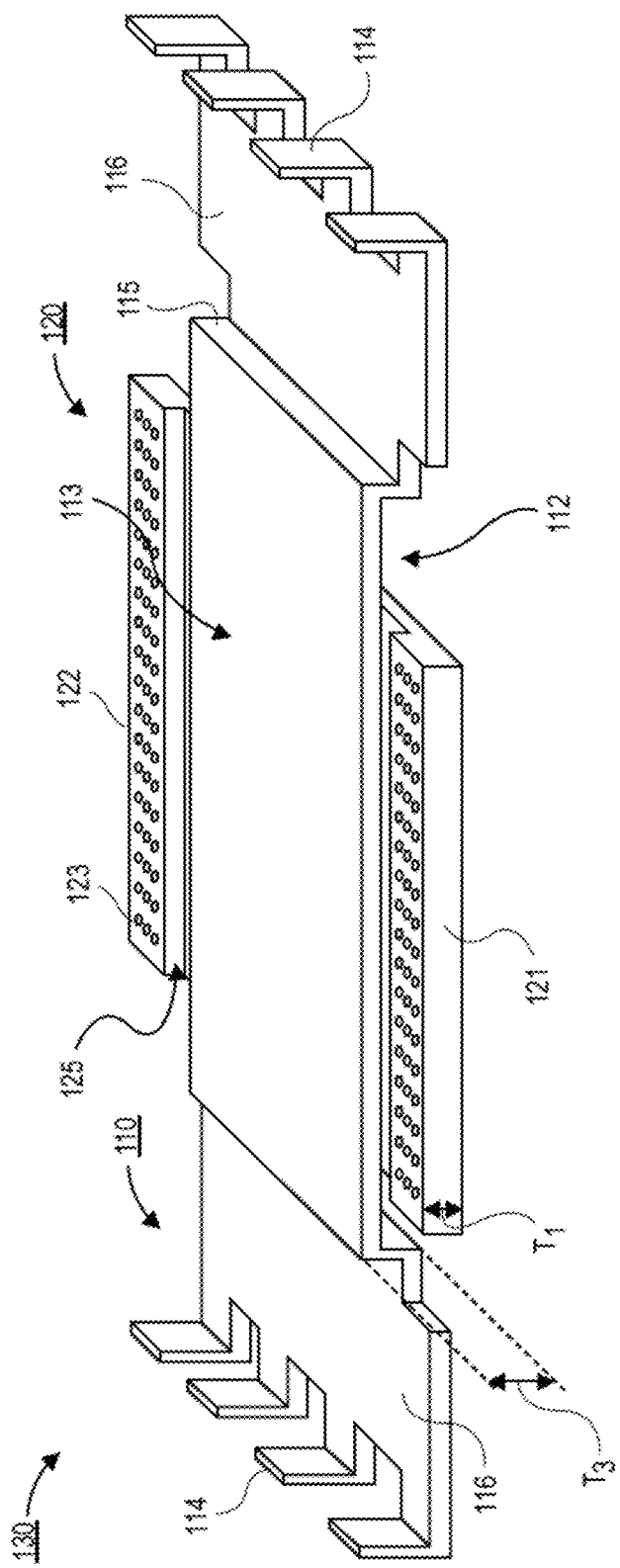
FIG. 1C is a perspective view illustration of an interposer assembly that comprises an interposer with a channel and a heat spreader set into the channel, in accordance with an embodiment.

Described herein are electronic packages with package on package (PoP) architectures that utilize novel thermal solutions to improve performance of the electronic package, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, PoP architectures suffer from poor thermal performance. Particularly, the thermal resistance between the system on a chip (SoC) and the thermal solution (e.g., heat spreader and/or heat sink) is high due to the overlying memory package, airgap between the memory package and SoC die, and the over molding component. Furthermore, larger thermal gradients are present on the SoC. The poor thermal performance results in decreased performance of the SoC. For example, this limits the continuous and burst performance possible for a given maximum junction temperature ($T_j$ max) allowed for the SoC. Accordingly, embodiments disclosed herein include improved thermal solutions for use with PoP architectures.

In an embodiment, PoP architectures disclosed herein include reduced thermal resistance between the SoC and the heat sink. The thermal resistance is improved by providing an interposer assembly that comprises an interposer and an integrated heat spreader. The heat spreader extends out past the SoC and is thermally coupled to the heat sink. The heat spreader also reduces the thermal gradient across the SoC. Furthermore, due to the interlocking nature of the heat spreader and the interposer, the overall Z-dimension of the PoP system is reduced compared to typical PoP architectures that do not include interlocking components. Particularly, existing PoP architectures exhibit increased Z-dimensions due to the addition of the heat spreader and the interposer over the memory package. In embodiments disclosed herein, a thermal interface material (TIM) is shifted from the top of the memory package to the top of the wing/extension of the heat spreader outside the periphery of the package. Additionally, an opening in the heat sink and/or EMI shield may be provided to accommodate the memory package, which is raised upwards by the heat spreader and the interposer. Embodiments may also include heat spreaders that may be in direct contact with the SoC and attached to the memory package with an adhesive. Placing the adhesive opposite from the SoC limits outgassing (due to heat) of the adhesive, and therefore, limits the formation of voids.

Referring now to FIG. 1A, a perspective view illustration of a heat spreader 110 that may be used in a PoP system is shown, in accordance with an embodiment. In an embodiment, the heat spreader 110 may comprise a main body 113 and arms 116 that extend out from edges of the main body 113. In some embodiments, the main body 113 may have a first width $W_1$ and the arms 116 may have a second width $W_2$. The first width $W_1$ may be smaller than the second width $W_2$ in some embodiments. That is, the heat spreader 110 may be referred to as having an I-shape. However, it is to be appreciated that the heat spreader 110 may comprise any shape. For example, the heat spreader 110 may have a T-shape (e.g., one of the arms 116 has a width $W_2$ and the other of the arms 116 has a width $W_1$, or only one arm 116 with a width $W_2$ extends out from the main body 113), rectangular (i.e., the main body 113 and the arms 116 may have the same width $W_1$), or any other suitable shape to accommodate a desired architecture. The main body 113 may have a length $L_1$ and the arms may have a length $L_2$. The length $L_2$ may be less than $L_1$. In an embodiment, the length $L_2$ of the arms may be 6 mm or larger. In some embodiments, the length $L_2$ may be 12 mm or larger. However, it is to be appreciated that the length $L_2$ may be any desired length in order to accommodate other structures of the PoP system.

In an embodiment, the arms 116 are out of plane with the main body 113. For example, in the illustrated embodiment, the arms 116 are below (in the Z-direction) the main body 113. The arms 116 may be coupled to the main body 113 with sidewalls 115. The out of plane configuration of the main body 113 and the arms 116 provides a recess 112 in the heat spreader. The recess 112 may be defined by the sidewalls 115 and the bottom surface of the main body 113.

In an embodiment, one or more legs 114 may extend in the Z-direction from the arms 116. As shown, four legs 114 extend out from each arm 116. However, it is to be appreciated that one or more legs 114 may be used. In other embodiments, the legs 114 may be omitted.

In an embodiment, the heat spreader 110 may be comprised of a material that has a low thermal resistance. For example, the heat spreader 110 may be a metallic material, such as copper. In some embodiments, the heat spreader 110 may be a monolithic structure. That is, the heat spreader 110 may be formed from a single sheet of the metallic material (e.g., with a stamping process, or other suitable forming process).

Referring now to FIG. 1B, a perspective view illustration of an interposer 120 is shown, in accordance with an embodiment. In an embodiment, the interposer 120 may comprise a first end 121 and a second end 122. The first end 121 may be on an opposite end of a center portion 124 of the interposer 120 relative to the second end 122. In an embodiment, the first end 121 and the second end 122 may comprise pads 123. The pads 123 may be conductive pads that connect to vias (not shown) that pass through a thickness of the interposer 120. In an embodiment, the interposer 120 may have a third length $L_3$. The third length may be less than the first length $L_1$ of the main body 113 of the heat spreader 110.

In an embodiment, the interposer 120 may comprise a channel 125. Particularly, the channel 125 may be located over the center portion 124 of the interposer 120. The channel 125 may have a third width $W_3$. In an embodiment, the third width $W_3$ may be equal to or greater than the first width $W_1$ of the main body 113 of the heat spreader 110. The channel 125 results in the interposer 120 having a non-uniform thickness. For example, the first end 121 and the second end 122 may have a first thickness $T_1$ and the center portion 124 may have a second thickness $T_2$ that is less than the first thickness $T_1$.

In an embodiment, the interposer 120 may be fabricated with standard packaging fabrication processes. For example, the interposer 120 may comprise a plurality of laminated organic layers (e.g., buildup layers). The channel 125 may be formed during the layup process in some embodiments. In an embodiment, conductive structures (e.g., vias, traces, or the like) may be formed with traditional package fabrication processes (e.g., semi-additive processes (SAP) or the like).

Referring now to FIG. 1C, a perspective view illustration of an interposer assembly 130 that comprises an interposer 120 and a heat spreader 110 is shown, in accordance with an embodiment. As shown, the recess 112 of the heat spreader 110 sits in the channel 125 of the interposer 120. Such a configuration may be referred to as an "interlocking" configuration in some embodiments. In an embodiment, the use of interlocking recesses 112 in the heat spreader 110 and channels 125 in the interposer 120 allows for the heat spreader 110 and the interposer 120 to be stacked over each other without significantly increasing the Z-dimension of the interposer assembly 130. For example, the first thickness $T_1$ of the first end 121 and the second end 122 of the interposer 120 may be substantially equal to a third thickness $T_3$ from the top surface of the main body 113 of the heat spreader 110 to the bottom surface of the arms 116. However, it is to be appreciated that variations in machining tolerances and/or the need for an adhesive (not visible) between the heat spreader 110 and the interposer 120 may result in the third thickness $T_3$ being different than the first thickness $T_1$.

Figure 2A:
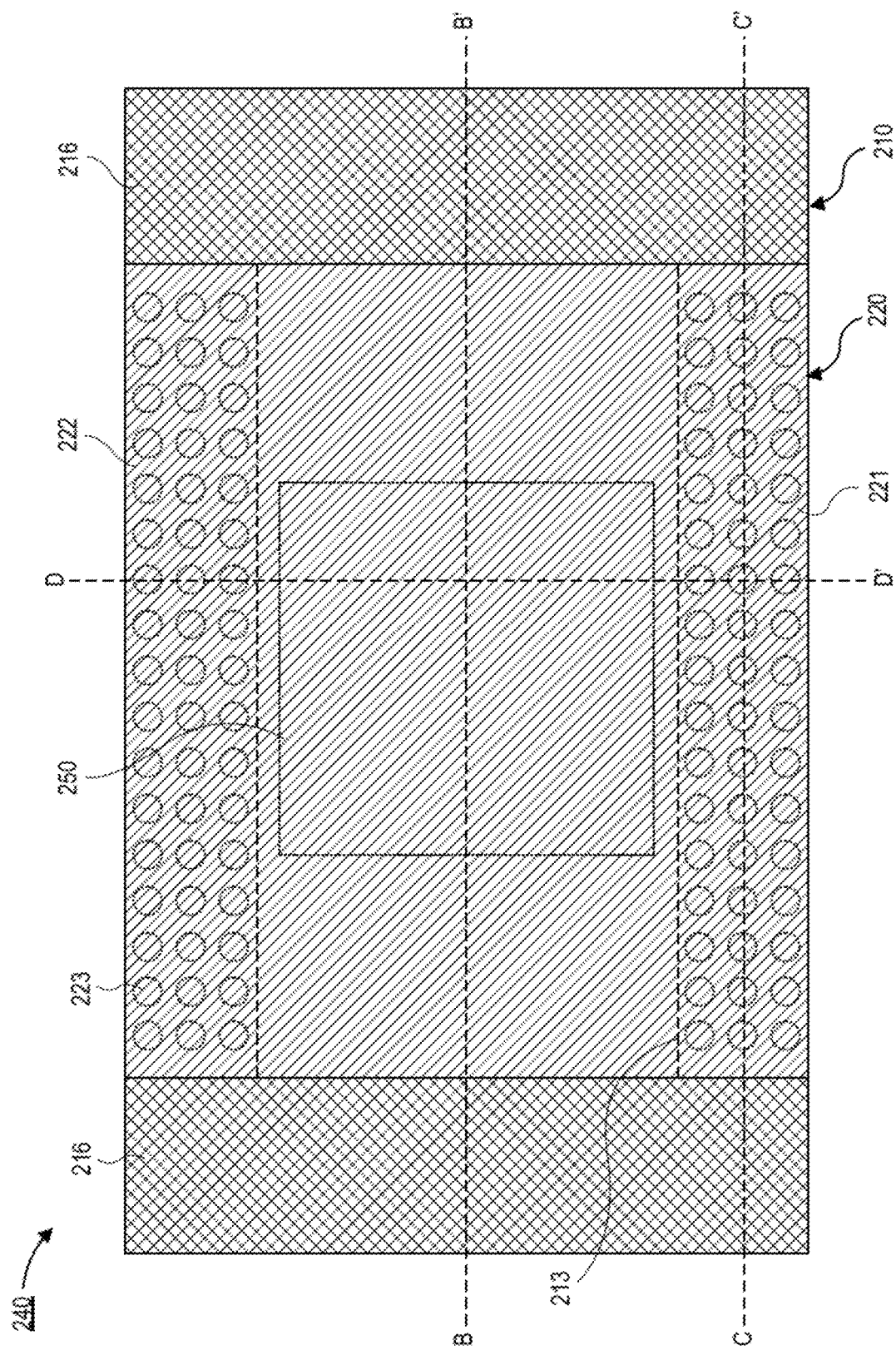
FIG. 2A is a plan view illustration of an interposer assembly of a package on package (PoP) system, in accordance with an embodiment.

Referring now to FIGS. 2A-2D, a plan view illustration and cross-sectional illustrations of a PoP system 240 are shown, in accordance with an embodiment. In FIG. 2A, only portions of the PoP system 240 (i.e., the interposer 220 and the heat spreader 210) are shown for simplicity. The remaining portions of the PoP system 240 are visible in the cross-sectional illustrations in FIGS. 2B-2D.

Referring now to FIG. 2A, a plan view illustration of the PoP system 240 is shown, in accordance with an embodiment. As shown, the interposer 220 extends over the main body 213 of the heat spreader 210 (indicated with dashed lines). The main body 213 of the heat spreader 210 may be between the first end 221 and the second end 222 of the interposer 220. The first end 221 an the second end 222 of the interposer 220 may comprise pads 223 to provide electrical connections through the interposer 220. The heat spreader 210 is over a die 250 (also indicated with dashed lines). In an embodiment, the portions of the heat spreader 210 (e.g., arms 216) may extend out past the edges of the interposer 220. The arms 216 may have a width that is greater than a width of the main body 213 (e.g., to provide an I-shaped structure). The arms 216 may also form any other shape, such as a T-shape, a rectangular shape, or any other shape to accommodate a desired architecture.

Figure 2B:
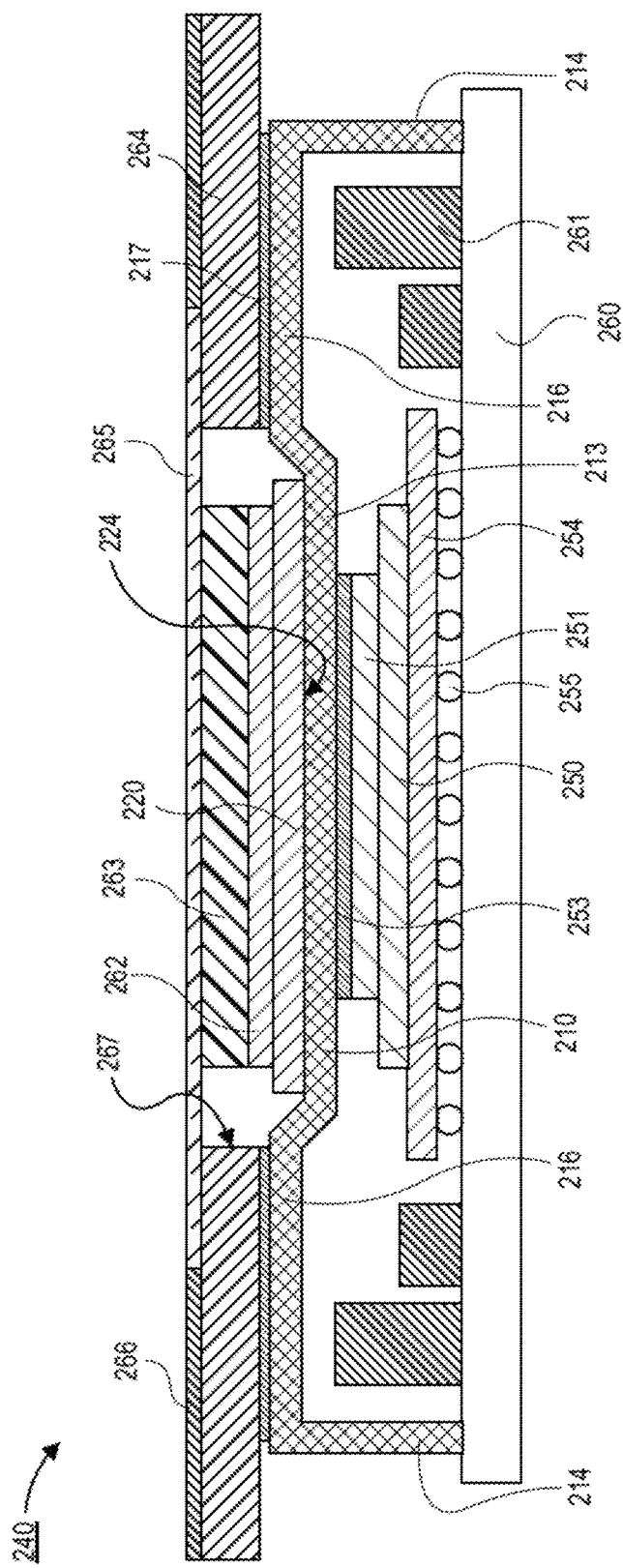
FIG. 2B is a cross-sectional illustration of the PoP system in FIG. 2A along line B-B', in accordance with an embodiment.

Referring now to FIG. 2B, a cross-sectional illustration of the PoP system 240 along line B-B' in FIG. 2A is shown, in accordance with an embodiment. The PoP system 240 may comprise a board 260. The board 260 may be any suitable board, such as a printed circuit board (PCB) or the like. In an embodiment, a bottom package substrate 254 may be attached to the board 260 (e.g., with interconnects 255). One or more dies 250, 251 may be attached to the bottom package substrate 254. While two dies 250, 251 are shown, it is to be appreciated that any number of dies may be attached to the bottom package substrate 254. The one or more dies 250, 251 may be processor dies, SoC dies or the like.

In an embodiment, the heat spreader 210 may be thermally coupled to the topmost die 251 with a thermal interface material (TIM) 253. Particularly, the main body 213 of the heat spreader 210 may be thermally coupled to the topmost die 251. In an embodiment, the arms 216 of the heat spreader 210 may extend out past the edges of the bottom package substrate 254. In some embodiments, legs 214 of the heat spreader 210 may extend down to the board 260. In other embodiments, the legs 214 may be omitted (e.g., when a mold material (not shown) below the heat spreader 210 provides support for the heat spreader 210. In an embodiment, the arms 216 and legs 214 may extend out past components 261 mounted to the board 260. The components 261 may comprise passive or active devices.

In an embodiment, the interposer 220 may be positioned over the main body 213 of the heat spreader 210. Particularly, the central portion 224 (e.g., where the channel is located) may be supported by the heat spreader 210. A top package substrate 262 may be attached to the interposer 220. A die 263 (or die stack) may be attached to the top package substrate 262. For example, the die 263 may be a memory die or a stack of memory dies that are communicatively coupled to the processor dies 250, 251 through the interposer 220.

In an embodiment, a heat sink 264 may be thermally coupled to the arms 216 of the heat spreader 210. The heat sink 264 may be thermally coupled to the arms 216 by a TIM 217 or the like. In an embodiment, the heat sink 264 may comprise an opening 267. The opening 267 may surround the die 263. In order to provide electrical shielding, a conductive film 265 may be disposed over the die 263 and span across the opening 267. In some embodiments, an additional heat spreader 266 (e.g., a graphite heat spreader) may be disposed over the top surface of the heat sink 264.

Figure 2C:
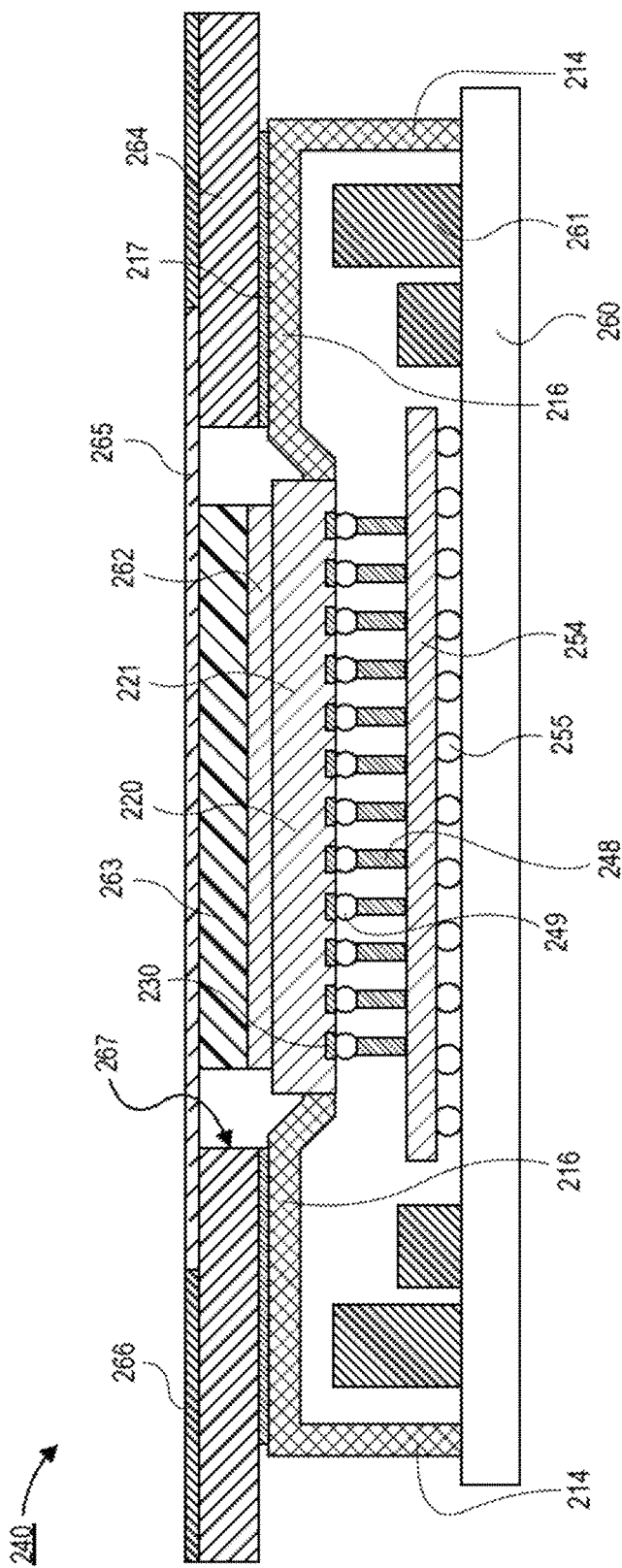
FIG. 2C is a cross-sectional illustration of the PoP system in FIG. 2A along line C-C', in accordance with an embodiment.

Referring now to FIG. 2C, a cross-sectional illustration of the PoP system 240 along line C-C' of FIG. 2A is shown, in accordance with an embodiment. Line C-C' extends along the first end 221 of the interposer 220. Accordingly, the stack of dies 250, 251 are not visible in the illustrated cross-section. Instead, the interconnects from the pads 230 down to the bottom package substrate 254 are shown. In the illustrated embodiment, the interconnects comprise a ball 249 stacked over a pillar 248. However, it is to be appreciated that any interconnect architecture may be used to provide a connection between the bottom package substrate 254 and the interposer 220.

As shown in FIG. 2C, the main body 213 of the heat spreader 210 is hidden. That is, the main body 213 sits in the channel (not shown FIG. 2C) in the interposer 220. Accordingly, only the arms 216 and legs 214 of the heat spreader 210 are visible in the cross-section depicted in FIG. 2C.

Figure 2D:
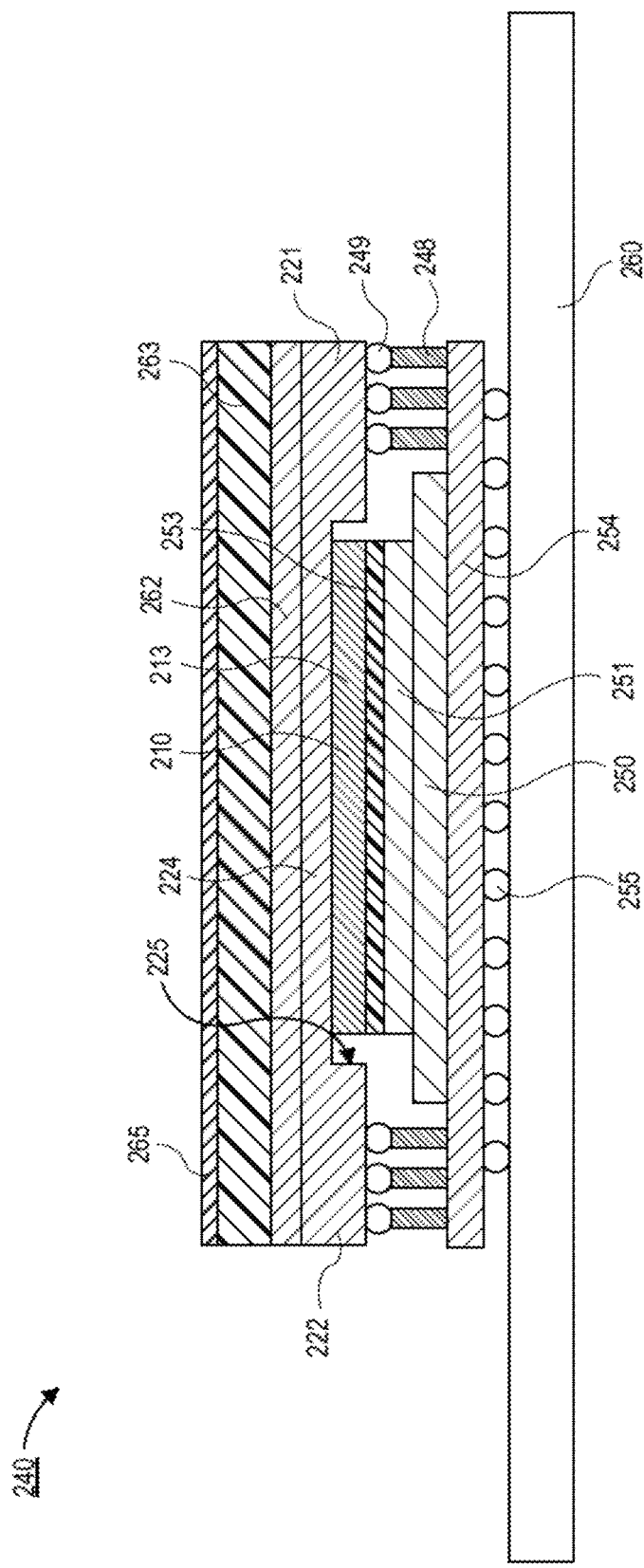
FIG. 2D is a cross-sectional illustration of the PoP system in FIG. 2A along line D-D', in accordance with an embodiment.

Referring now to FIG. 2D, a cross-sectional illustration of the PoP system 240 along line D-D' is shown, in accordance with an embodiment. The cross-section in FIG. 2D clearly depicts the channel 225 of the interposer 220. For example, the first end 221 and the second end 222 of the interposer 220 may be separated by a central portion 224. The central portion 224 may have a smaller thickness in order to accommodate the main body 213 of the heat spreader 210. In an embodiment, a width of the main body 213 may be less than a width of the channel 225. In other embodiments, the width of the main body 213 may be substantially equal to the width of the channel 225.

Figure 2E:
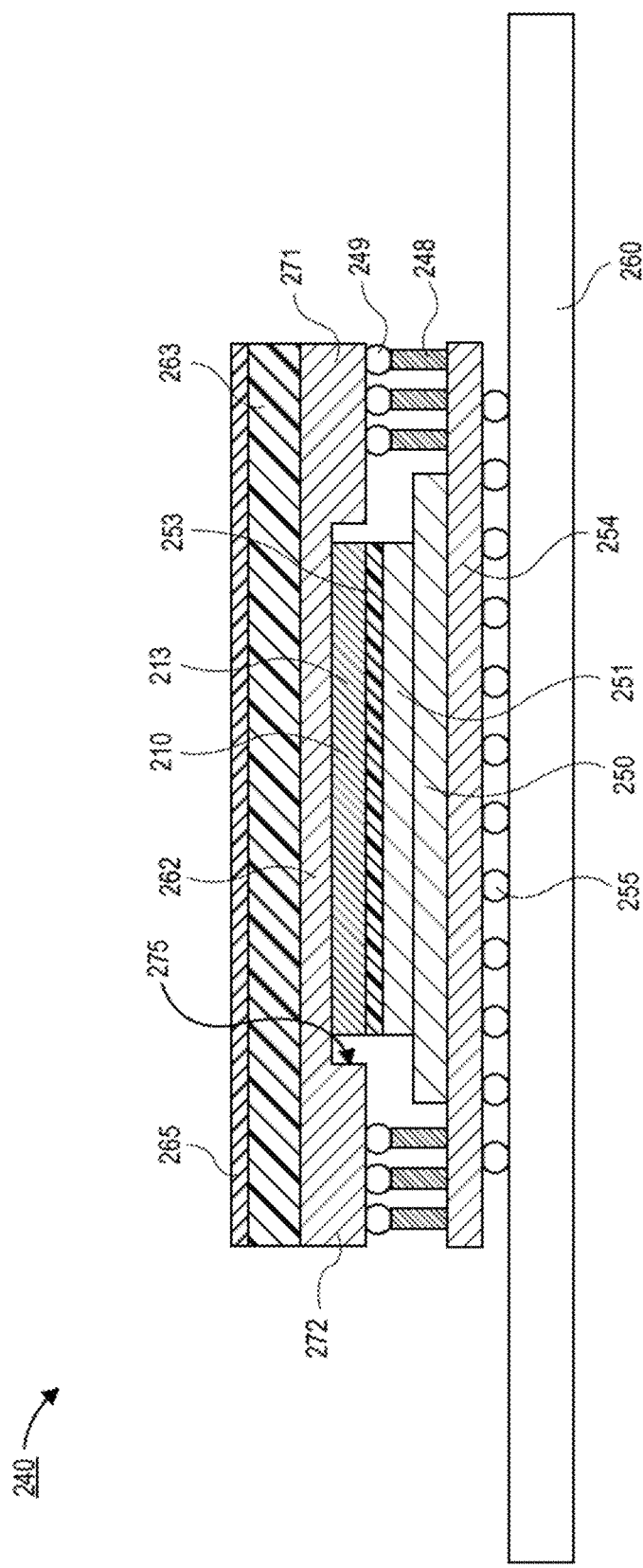
FIG. 2E is a cross-sectional illustration of a PoP system without an interposer, in accordance with an embodiment.

Referring now to FIG. 2E, a cross-sectional illustration of a PoP system 240 is shown, in accordance with an additional embodiment. In the additional embodiment, the package substrate 262 may replace the interposer 220. That is, the interposer 220 may optionally be omitted, and the package substrate 262 interfaces with the heat spreader 210. Such an embodiment would result in a decrease in the Z-dimension. As shown, the package substrate 262 may have a first end 271 and a second end 272 that are separated by a channel 275. The heat spreader 210 may interlock with the channel 275, similar to the interlocking nature of the heat spreader 210 and the interposer 220 described above. However, in such embodiments the package substrate 262 may need to be a custom PoP memory package.

Figure 2F:
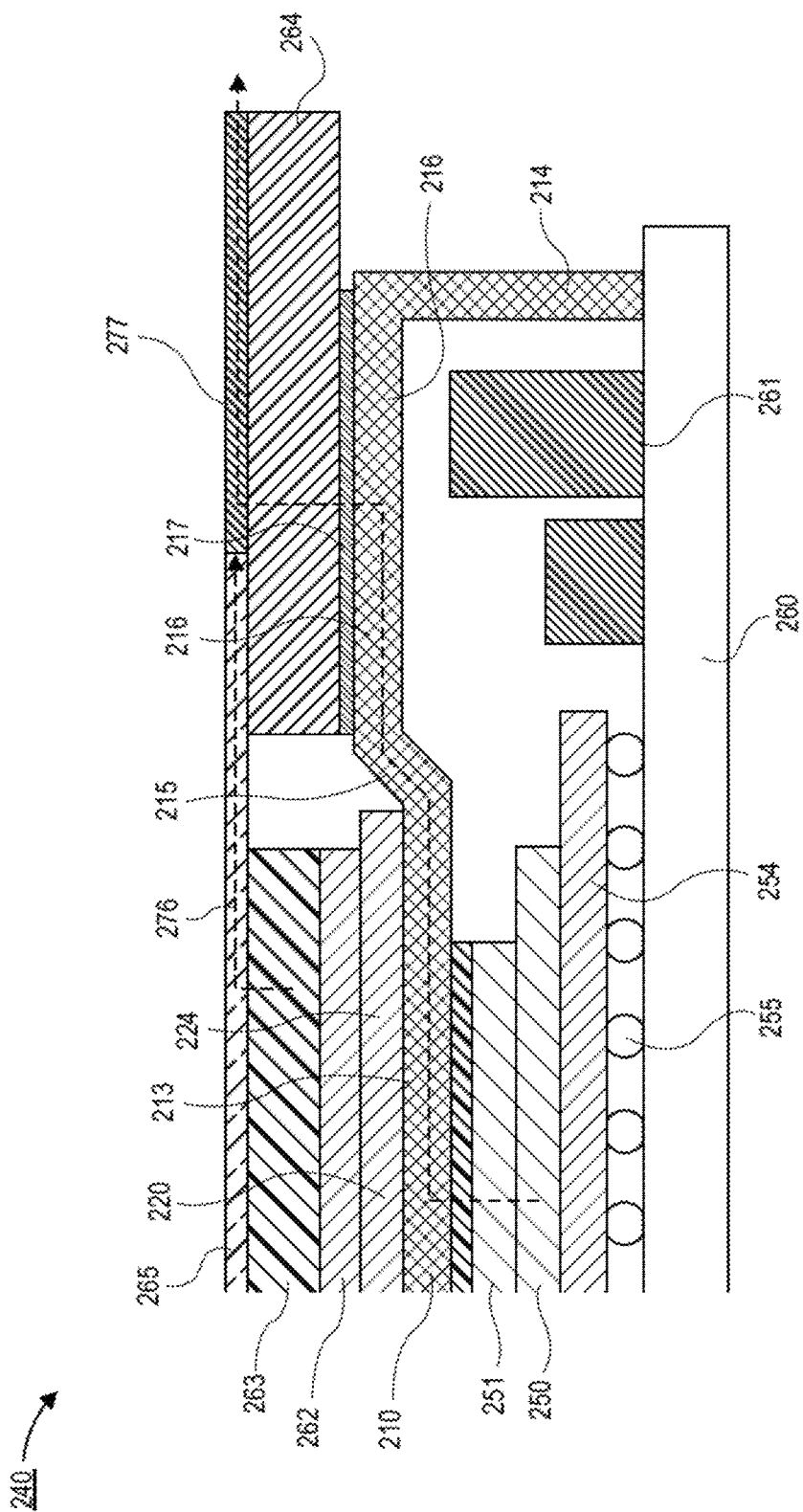
FIG. 2F is a cross-sectional illustration of a portion of a PoP system that illustrates the paths of low thermal resistance to provide heat dissipation, in accordance with an embodiment.

Referring now to FIG. 2F, a cross-sectional illustration of a portion of the PoP system 240 is shown, in accordance with an embodiment. Particularly, FIG. 2F illustrates a portion of the PoP system along line B-B' of FIG. 2A. The cross-section in FIG. 2E illustrates paths 277, 276 of low thermal resistance that are enabled by embodiments disclosed herein. In an embodiment, the path 277 starts at the dies 250, 251, enters the heat spreader 210 and laterally extends out along the connector 215 to the arms 216. The path 277 then has access to the heat sink 264 through the TIM 217. Such a path bypasses the traditional thermal path of PoP architectures (i.e., up through the upper package and the memory die). That is, the heat spreader 210 provides a low thermal resistance path 277 that runs laterally beyond the edge of the upper package before interfacing with heat sink 264 (which is also around the upper package). In an embodiment, the path 276 along conductive film 265 provides a low thermal resistance path to reduce heating of the die 263.

Embodiments that use an extended metal heat spreader 210 under the interposer 220 to bring out the heat from the die 250, 251 directly, (i.e., bypassing the top package substrate 262, increases the thermal performance which will in turn improve the die benchmark performances. Furthermore, since the heat transfer is happening from the top of the interposer which is lower than the top package substrate 262 of the PoP package, the height of the thermal solution will not get added to the die stack up and hence nullify the contribution of the thickness of the added heat spreader 210 (and interposer 220) to device thickness. Additionally, memory cost is reduced and inventory and supply chain management of memory is avoided due to the use of an interposer which eliminates the need to use custom memory packages. This reduces cost and lead time is improved.

Referring now to FIGS. 3A-3F, a series of cross-sectional illustrations depicting a process for assembling an interposer comprising an interposer 320 and an interlocking heat spreader 310 is shown, in accordance with an embodiment. It is to be appreciated that manufacturing tolerances may not allow for perfect matching of the depth of the channel 325 with the thickness of the heat spreader 310. Accordingly, embodiments include the use of an adhesive 329 that accommodates for any manufacturing variations.

Figure 3A:
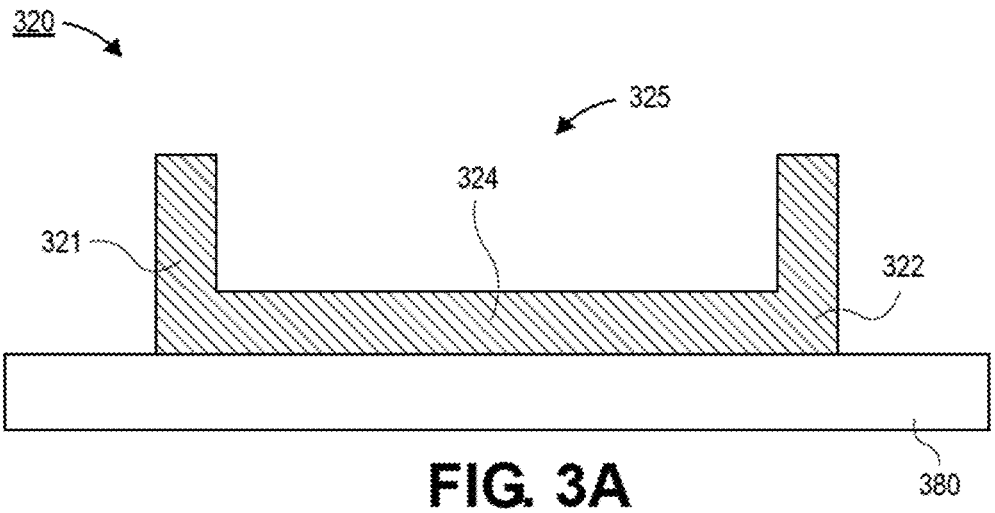
FIG. 3A is a cross-sectional illustration of an interposer with a channel, in accordance with an embodiment.

Referring now to FIG. 3A, a cross-sectional illustration of an interposer 320 supported on a surface 380 is shown, in accordance with an embodiment. In an embodiment, the interposer 320 may comprise a center region 324, a first end 321, and a second end 322. In an embodiment, the center region 324 may have a thickness that is less than thicknesses of the first end 321 and the second end 322. Accordingly, the interposer 320 includes a channel 325 over the center region 324.

Figure 3B:
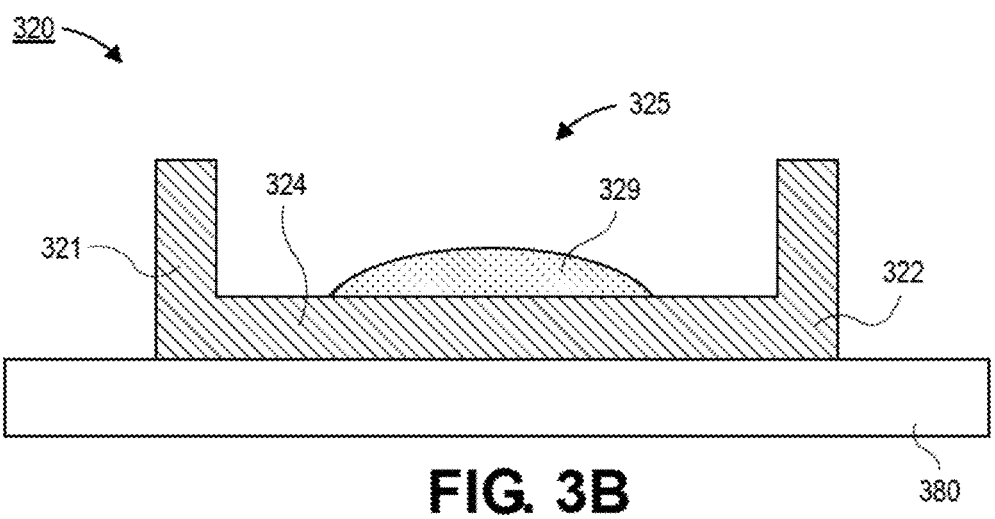
FIG. 3B is a cross-sectional illustration of the interposer after an adhesive is dispensed into the channel, in accordance with an embodiment.

Referring now to FIG. 3B, a cross-sectional illustration after an adhesive 329 is disposed in the channel 325. In an embodiment, the volume of the adhesive 329 may be the same across all interposer assemblies. That is, the volume of the adhesive 329 may not be changed in order to account for variations inherent in the manufacturing of the interposer 320 or the heat spreader 310.

Figure 3C:
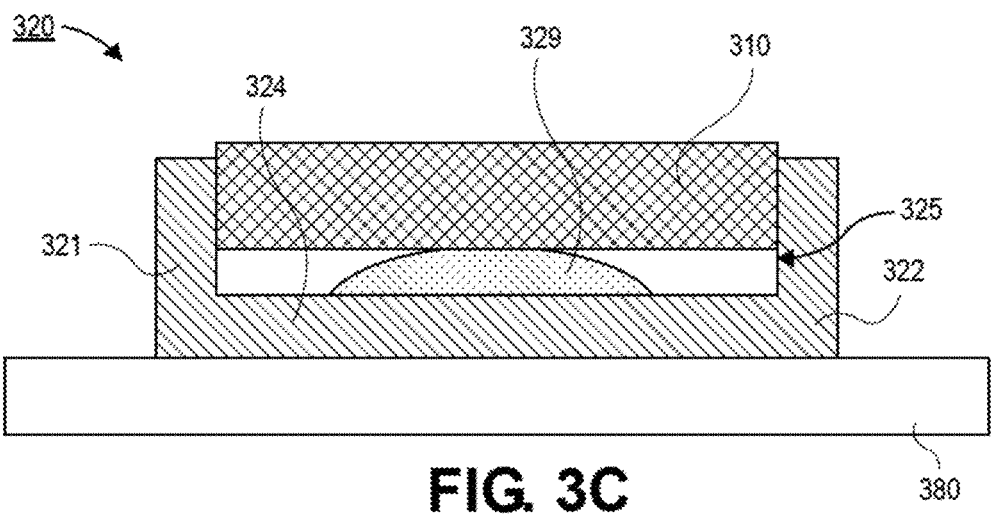
FIG. 3C is a cross-sectional illustration of the interposer after a heat spreader is inserted into the channel, in accordance with an embodiment.

Referring now to FIG. 3C, a cross-sectional illustration after the heat spreader 310 is placed over the channel 325 is shown, in accordance with an embodiment. In an embodiment, the heat spreader 310 may be supported by the adhesive 329. That is, a top surface of the heat spreader 310 may be above a top surface of the first end 321 and the second end 322.

Figure 3D:
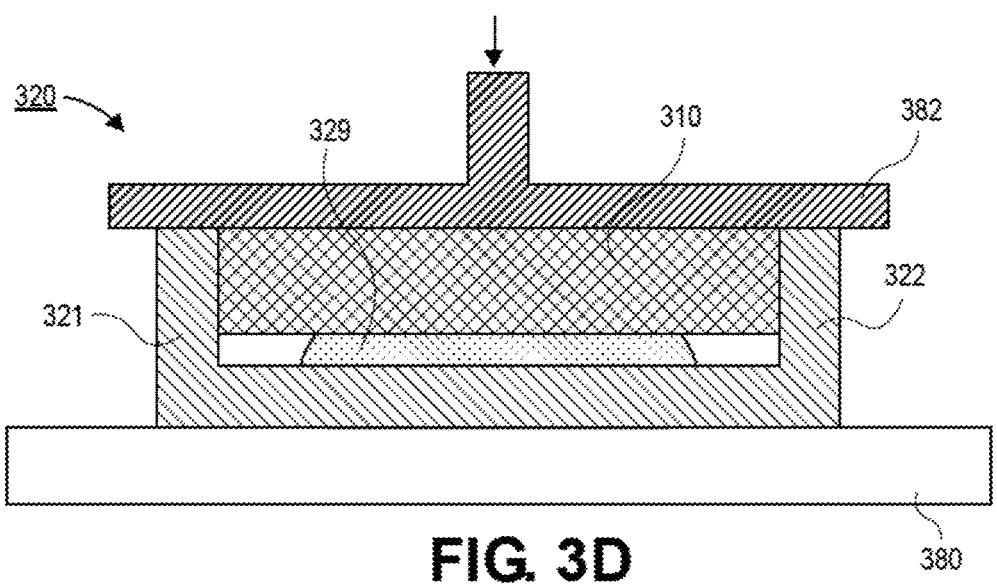
FIG. 3D is a cross-sectional illustration of the interposer after the heat spreader is pressed down with a press so that surfaces of the interposer are substantially coplanar with a surface of the heat spreader, in accordance with an embodiment.

Referring now to FIG. 3D, a cross-sectional illustration after a press 382 is brought into contact with the heat spreader 310 and pressed down is shown, in accordance with an embodiment. As shown by the arrow, the press 382 forces the heat spreader 310 down into the channel 325. In an embodiment, the press 382 extends past the edges of the heat spreader 310 and over the first end 321 and the second end 322 of the interposer 320. Accordingly, the top surfaces 326 of the first end 321 and the second end 322 halt the advancement of the press 382 and results in the top surface 313 of the heat spreader 310 being substantially coplanar with top surfaces 326 of the first end 321 and the second end of the interposer 320.

Figure 3E:
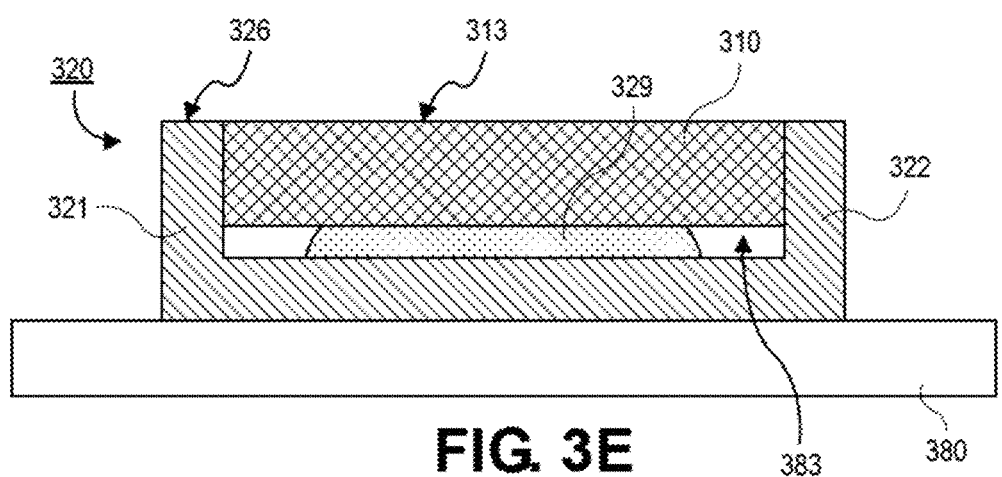
FIG. 3E is a cross-sectional illustration after the press is removed, in accordance with an embodiment.
Figure 3F:
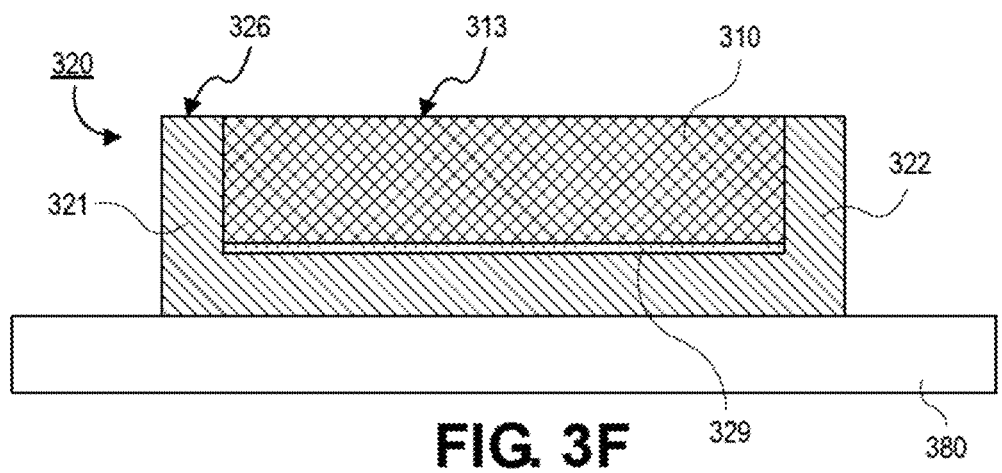
FIG. 3F is a cross-sectional illustration of an interposer with a heat spreader that has a thickness that is closer to the depth of the channel than is the case in FIG. 3E, in accordance with an embodiment.

Referring now to FIG. 3E, a cross-sectional illustration after the press 382 is removed is shown, in accordance with an embodiment. In an embodiment, the adhesive 329 may be cured in order to prevent further displacement of the heat spreader 310. The cured adhesive 329 may partially fill the channel 325 leaving voids 383. The volume of the voids 383 may correspond to variations between the thickness of the heat spreader 310 and the depth of the channel 325. For example, larger differences will result in larger voids 383. In cases where the difference between the thickness of the heat spreader 310 and the depth of the channel 325 is smaller, the volume of the voids 383 may be reduced or even eliminated (as shown in FIG. 3F). Since the adhesive is between the interposer and the heatspreader and not between the die and the heatspreader it's thickness or thermal conductivity does not have substantial effect on the thermal performance of the package.

As noted above, the poor thermal performance of PoP systems also results from high thermal gradients on the bottom die. Thermal gradients across the die result in high junction temperatures for a give power dissipated on the die. This reduces the performance of the PoP package. Whereas non-PoP package architectures may attach a heat spreader directly to the die with a thin TIM, such configurations are not currently possible in PoP architectures, as is described above. Accordingly, embodiments disclosed herein also include a heat spreader that is directly attached to the die to reduce the thermal gradients below the PoP memory package. An example of such an embodiment is shown in FIG. 4A.

Figure 4A:
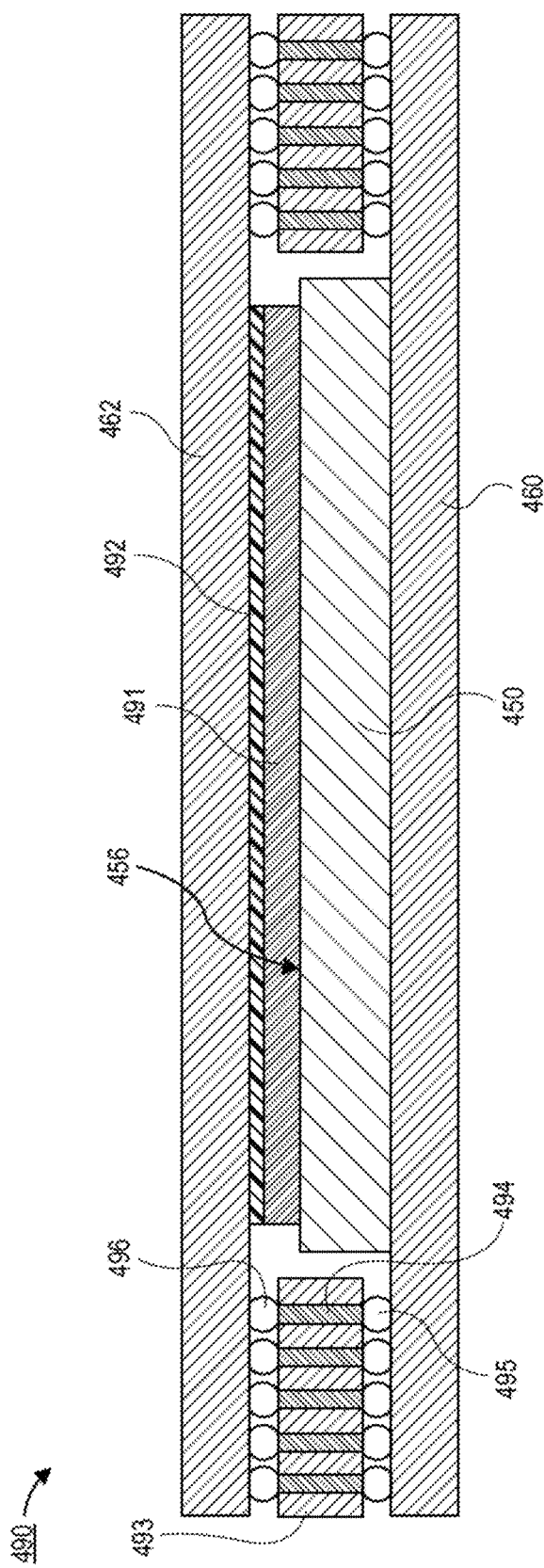
FIG. 4A is a cross-sectional illustration of a PoP system with a heat spreader between the processor die and the memory package, where an adhesive is applied between the heat spreader and the memory package, in accordance with an embodiment.

Referring now to FIG. 4A, a cross-sectional illustration of a PoP system 490 with a heat spreader 491 for reducing thermal gradients on the die 450 is shown, in accordance with an embodiment. In an embodiment, the die 450 may be attached to a bottom package 460. The die 450 may be electrically connected to a spacer 493 that is connected to a top package 462. For example, the top package 462 may include additional dies (not shown) such as memory dies. In an embodiment, the spacer 493 may comprise through vias 494 and be connected to the top package 462 by interconnects 496 and to the bottom package 460 by interconnects 495.

In an embodiment, a heat spreader 491 may be disposed directly over a top surface 456 of the die 450. For example, the heat spreader 491 may be a soft grade high in-plane conductivity graphite. This will not only increase the effective die conductivity but also help fill the micro-level surface irregularities on the top surface 456 of the die 450. In an embodiment, the heat spreader 491 is secured to the top package 462 by an adhesive 492. Positioning the adhesive opposite from the die 450 minimizes die thermal resistance and to reduces the chances of the adhesive 492 outgassing due to direct heat from the die 450. As the adhesive does not play much of a role in thermal spreading or heat dissipation, high temperature adhesive 492 (even with low thermal conductivity) can also be used to further reduce voids in the adhesive 492.

As shown in FIG. 4A, the spacer 493 provides the necessary clearance between the bottom surface of the top package 462 and the top surface 456 of the die 450 to include the heat spreader 491 and the adhesive 492. Accordingly, by changing the thickness of the spacer 493, the thickness of the heat spreader 491 may also be increased or decreased. This allows for simple product segmentation by changing the thermal performance (i.e., by changing the thickness of the heat spreader 491) of the PoP system 490.

Figure 4C:
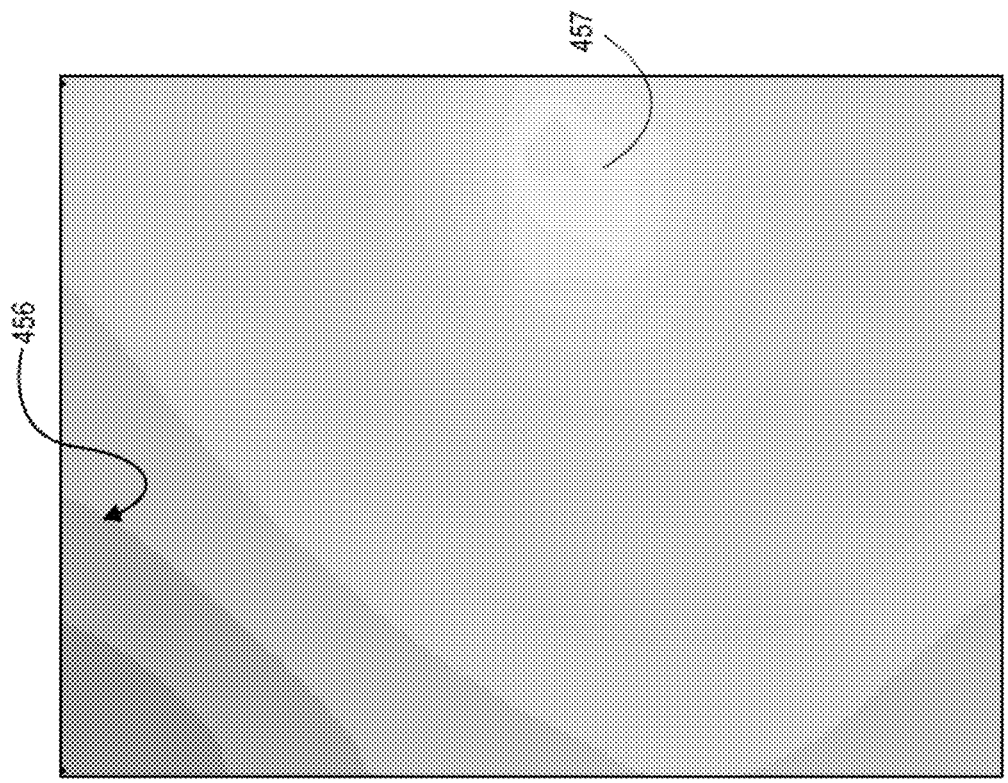
FIG. 4C is a heat map of a processor die with a thermal solution such as the one illustrated in FIG. 4A, in accordance with an embodiment.
Figure 4B:
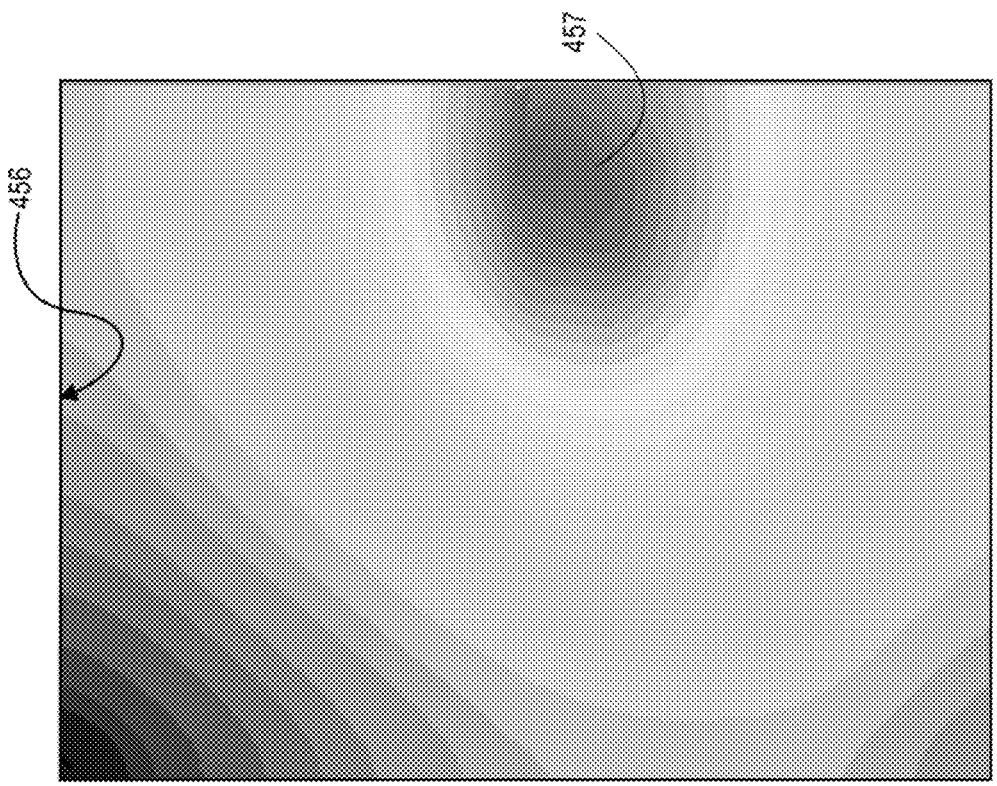
FIG. 4B is a heat map of a processor die without an adequate thermal solution.

Referring now to FIGS. 4B and 4C, a comparison of the thermal gradients on a surface 456 of a SoC die of an exemplary die in PoP systems are shown. In FIG. 4B the die is part of a PoP system that does not include a heat spreader 491, and in FIG. 4C the die is part of a PoP system 490 that does include a heat spreader 491. As shown in FIG. 4B, the thermal gradient is large (e.g., approximately 40° C.) with a maximum temperature at location 457 being approximately 100° C. In comparison, the embodiment displayed in FIG. 4C illustrates a much smaller thermal gradient (e.g., approximately 20° C.) with a maximum temperature at location 457 being approximately 75° C. Accordingly, the highest die temperature may be decreased by approximately 25° C., which translates into an increase of 35% in sustained performance (i.e., PL1).

PoP systems, such as the PoP system 490 illustrated in FIG. 4A include several benefits. One benefit is that the high in-plane conductivity of the heat spreader 491 drastically reduces the die temperature gradient and provides a lower junction temperature. This may increase sustained die performance (i.e., PL1) by up to 35%. Additionally, slower temperature rise and reduced highest junction temperature makes higher turbo/burst performance (i.e., PL2) possible. Simulations have shown improvements of more than 60% in such power regimes when using PoP systems 490 such as those described herein. Lower junction and average die temperature also provides lower leakage power (i.e., higher die 450 power efficiency (performance/Watt)). In yet another advantage, heat spreaders 491 may also provide lower memory package temperatures which also enhances memory performance.

Figure 5:
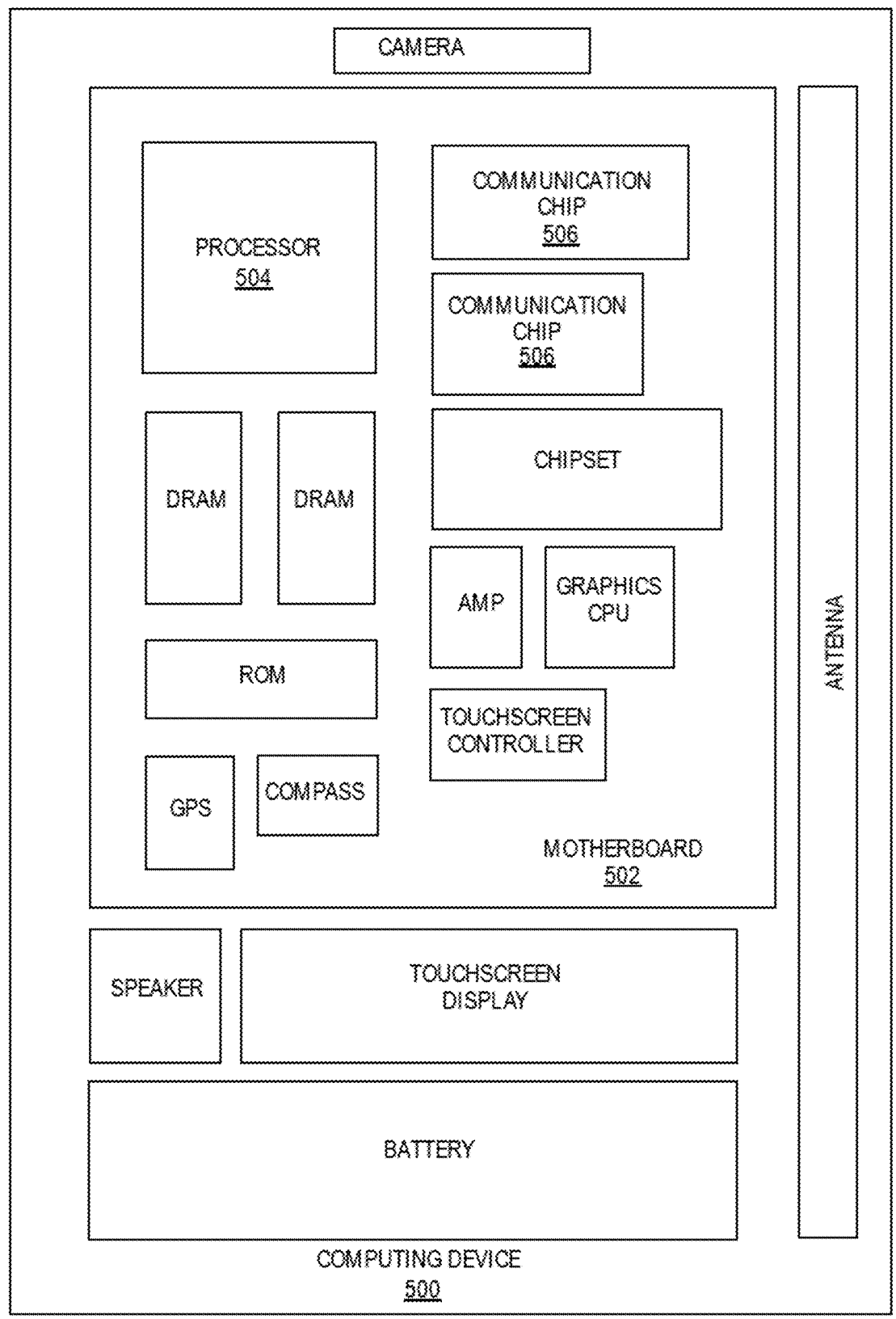
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be packaged in a PoP system with an interposer assembly that comprises an interposer with a channel and a heat spreader sitting in the channel, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be packaged in a PoP system with an interposer assembly that comprises an interposer with a channel and a heat spreader sitting in the channel, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 an interposer assembly, comprising: an interposer, wherein the interposer has a first end and a second end; a plurality of pads over the first end and the second end of the interposer; a channel in the interposer between the first end and the second end; and a heat spreader positioned in the channel.

Example 2 the interposer assembly of Example 1, wherein the channel extends entirely across a first length of the interposer.

Example 3 the interposer assembly of Example 2, wherein the heat spreader has a second length that is larger than the first length.

Example 4 the interposer assembly of Examples 1-3, wherein the heat spreader has a legs extending away from the interposer.

Example 5 the interposer assembly of Examples 1-4, wherein the heat spreader comprises a recess.

Example 6 the interposer assembly of Example 5, wherein the recess interfaces with the channel.

Example 7 the interposer assembly of Examples 1-6, wherein the heat spreader is secured to the interposer by an adhesive.

Example 8 the interposer assembly of Examples 1-7, wherein a surface of the heat spreader is substantially coplanar with a surface of the interposer.

Example 9 the interposer assembly of Examples 1-8, wherein the heat spreader comprises an I-shaped profile, a T-shaped profile, or a rectangular shaped profile.

Example 10 an electronic package, comprising: a first package substrate; a first die stack over the first package substrate; a heat spreader over the first die stack, wherein the heat spreader comprises arms that extend out past sidewalls of the first package substrate; an interposer over and around the heat spreader, wherein the interposer is electrically coupled to the first package substrate by a plurality of interconnects; a second package substrate over the interposer; and a second die over the second package substrate.

Example 11 the electronic package of Example 10, wherein the interposer comprises a channel, and wherein the heat spreader sits in the channel.

Example 12 the electronic package of Example 10 or Example 11, further comprising: a thermally conductive plate over the arms of the heat spreader, wherein the thermally conductive plate comprises an opening that surrounds the second die.

Example 13 the electronic package of Example 12, wherein a top surface of the thermally conductive plate is substantially coplanar with a top surface of the second die stack.

Example 14 the electronic package of Example 12 or Example 13, wherein the opening is covered by a conductive tape.

Example 15 the electronic package of Examples 12-14, wherein a second heat spreader is over the thermally conductive plate.

Example 16 the electronic package of Examples 12-15, wherein a thermal interface material couples the thermally conductive plate to the arms.

Example 17 the electronic package of Examples 10-16, further comprising: a board, wherein the first package substrate is electrically coupled to the board.

Example 18 the electronic package of Example 17, wherein the heat spreader further comprises: legs extending down from the arms, wherein the legs are supported on the board.

Example 19 an electronic package, comprising: a first package substrate; a first die stack over the first package substrate; a heat spreader over the first die stack; a conductive adhesive over the heat spreader; and a second package substrate over the conductive adhesive.

Example 20 the electronic package of Example 19, wherein the first package substrate is electrically coupled to the second package substrate by a spacer that is laterally adjacent to the first die stack.

Example 21 the electronic package of Example 20, wherein the spacer comprises a plurality of layers, and wherein a plurality of through spacer vias pass through the plurality of layers.

Example 22 the electronic package of Examples 19-21, wherein a second die stack is over the second package substrate, and wherein the first die stack is a compute die stack, and wherein the second die stack is a memory die stack.

Example 23 an electronic package, comprising: a first package substrate; a first die stack over the first package substrate; a heat spreader over the first die stack, wherein the heat spreader comprises arms that extend out past sidewalls of the first package substrate; a second package substrate over and around the heat spreader, wherein the second package is electrically coupled to the first package substrate by a plurality of interconnects; and a second die over the second package substrate.

Example 24 the electronic package of Example 23, wherein the second package substrate is a custom memory package.

Example 25 the electronic package of Example 23 or Example 24, wherein the second package substrate comprises a channel.

What is claimed is:
1. An interposer assembly, comprising:
   an interposer, wherein the interposer has a first end and a second end;
   a plurality of pads over the first end and the second end of the interposer;

a channel in the interposer between the first end and the second end; and a heat spreader positioned in the channel, wherein a surface of the heat spreader is substantially coplanar with a surface of the interposer.

2. The interposer assembly of claim 1, wherein the channel extends entirely across a first length of the interposer.

3. The interposer assembly of claim 2, wherein the heat spreader has a second length that is larger than the first length.

4. The interposer assembly of claim 1, wherein the heat spreader has a legs extending away from the interposer.

5. The interposer assembly of claim 1, wherein the heat spreader comprises a recess.

6. The interposer assembly of claim 5, wherein the recess interfaces with the channel.

7. The interposer assembly of claim 1, wherein the heat spreader is secured to the interposer by an adhesive.

8. The interposer assembly of claim 1, wherein the heat spreader comprises an I-shaped profile, a T-shaped profile, or a rectangular shaped profile.

9. An electronic package, comprising:
a first package substrate;
a first die stack over the first package substrate;
a heat spreader over the first die stack, wherein the heat spreader comprises arms that extend out past sidewalls of the first package substrate;
an interposer over and around the heat spreader, wherein the interposer is electrically coupled to the first package substrate by a plurality of interconnects;
a second package substrate over the interposer;
a second die over the second package substrate; and
a thermally conductive plate over the arms of the heat spreader, wherein the thermally conductive plate comprises an opening that surrounds the second die.

10. The electronic package of claim 9, wherein the interposer comprises a channel, and wherein the heat spreader sits in the channel.

11. The electronic package of claim 9, wherein a top surface of the thermally conductive plate is substantially coplanar with a top surface of the second die.

12. The electronic package of claim 9, wherein the opening is covered by a conductive tape.

13. The electronic package of claim 9, wherein a second heat spreader is over the thermally conductive plate.

14. The electronic package of claim 9, wherein a thermal interface material couples the thermally conductive plate to the arms.

15. The electronic package of claim 9, further comprising:
a board, wherein the first package substrate is electrically coupled to the board.

16. The electronic package of claim 15, wherein the heat spreader further comprises:
legs extending down from the arms, wherein the legs are supported on the board.

17. An electronic package, comprising:
a first package substrate;
a first die stack over the first package substrate;
a heat spreader over the first die stack;
a conductive adhesive over the heat spreader; and
a second package substrate over the conductive adhesive, wherein a surface of the heat spreader is substantially coplanar with a surface of the second package substrate.

18. The electronic package of claim 17, wherein the first package substrate is electrically coupled to the second package substrate by a spacer that is laterally adjacent to the first die stack.

19. The electronic package of claim 18, wherein the spacer comprises a plurality of layers, and wherein a plurality of through spacer vias pass through the plurality of layers.

20. The electronic package of claim 19, wherein a second die stack is over the second package substrate, and wherein the first die stack is a compute die stack, and wherein the second die stack is a memory die stack.

21. An electronic package, comprising:
a first package substrate;
a first die stack over the first package substrate;
a heat spreader over the first die stack, wherein the heat spreader comprises arms that extend out past sidewalls of the first package substrate;
a second package substrate over and around the heat spreader, wherein the second package substrate is electrically coupled to the first package substrate by a plurality of interconnects, wherein a surface of the second package substrate is substantially coplanar with a surface of the heat spreader; and
a second die over the second package substrate.

22. The electronic package of claim 21, wherein the second package substrate is a custom memory package substrate.

23. The electronic package of claim 21, wherein the second package substrate comprises a channel.

24. An electronic package, comprising:
a first package substrate;
a first die stack over the first package substrate;
a heat spreader over the first die stack, wherein the heat spreader comprises arms that extend out past sidewalls of the first package substrate;
an interposer over and around the heat spreader, wherein the interposer is electrically coupled to the first package substrate by a plurality of interconnects;
a second package substrate over the interposer; and
a second die over the second package substrate; and
a board, wherein the first package substrate is electrically coupled to the board, wherein the heat spreader further comprises legs extending down from the arms, wherein the legs are supported on the board.

* * * * *